(12) United States Patent
Miller, Jr.

(10) Patent No.: US 6,466,885 B2
(45) Date of Patent: *Oct. 15, 2002

(54) LINE TESTER

(75) Inventor: Garth Miller, Jr., Rockford, IL (US)

(73) Assignee: Greenlee Textron Inc., Rockford, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/302,923

(22) Filed: Apr. 30, 1999

(65) Prior Publication Data

US 2002/0045996 A1 Apr. 18, 2002

Related U.S. Application Data

(60) Provisional application No. 60/084,526, filed on May 7, 1998.

(51) Int. Cl.⁷ .................. G06F 19/00; G06F 18/00; H04B 3/46
(52) U.S. Cl. .............. 702/116; 703/183; 703/185; 324/539
(58) Field of Search ............... 702/35, 57–59, 702/81–84, 116–120, 124, 183, 185, 64, 65, 108, 121–123; 324/539, 540, 542, 541, 543; 340/651

(56) References Cited

U.S. PATENT DOCUMENTS

| | | | | |
|---|---|---|---|---|
| 3,678,379 A | * | 7/1972 | Arvay et al. | 324/539 |
| 4,471,293 A | * | 9/1984 | Schack | 324/540 |
| 4,524,320 A | * | 6/1985 | Brooks | 324/66 |
| 4,937,519 A | * | 6/1990 | Fields, III | 324/66 |
| 4,943,993 A | * | 7/1990 | Fore | 379/6 |
| 4,992,739 A | * | 2/1991 | Kosch | 324/540 |
| 5,027,074 A | * | 6/1991 | Haferstat | 324/539 |
| 5,280,251 A | * | 1/1994 | Strangio | 324/539 |
| 5,285,163 A | * | 2/1994 | Liotta | 324/508 |
| H1369 H | * | 11/1994 | Verbin | 324/539 |
| 5,420,512 A | * | 5/1995 | Spillane et al. | 324/539 |
| 5,477,142 A | * | 12/1995 | Hayhurst | 324/542 |
| 5,530,367 A | * | 6/1996 | Bottman | 324/616 |
| 5,552,699 A | * | 9/1996 | Redmer | 324/66 |
| 5,598,342 A | | 1/1997 | Siemon et al. | 702/117 |

* cited by examiner

*Primary Examiner*—Marc S. Hoff
*Assistant Examiner*—Manuel L. Barbee
(74) *Attorney, Agent, or Firm*—Trexler, Bushnell, Giangiorgi, Blackstone & Marr, Ltd.

(57) ABSTRACT

A cable testing system for testing individual lines of a cable. The cable testing system includes a main unit having an input jack and a plurality of identifying lights connected to the input jack, and at least one remote module including an input jack and an output jack, a power source in communication with the output jack, and a plurality of identifying lights connected to the input jack. Preferably, the output jack of the remote module is configured to receive one end of a multiple line cable and the input jacks of both the main unit and remote module are configured to receive the other end of the multiple line cable. The remote module preferably includes a test signal generator configured to send test signals sequentially along each line of the cable, and includes an identifying signal generator which is configured to send an identifying signal along a line of the cable. The identifying signal generator may include a signal generator which is connected to a line selector, where the line selector is set-able to specify which line of the cable the identifying signal is sent along. Preferably, neither the main unit nor the remote module includes a microprocessor, thereby reducing cost. Additionally, preferably the remote module can be used as a stand-alone line tester.

6 Claims, 3 Drawing Sheets

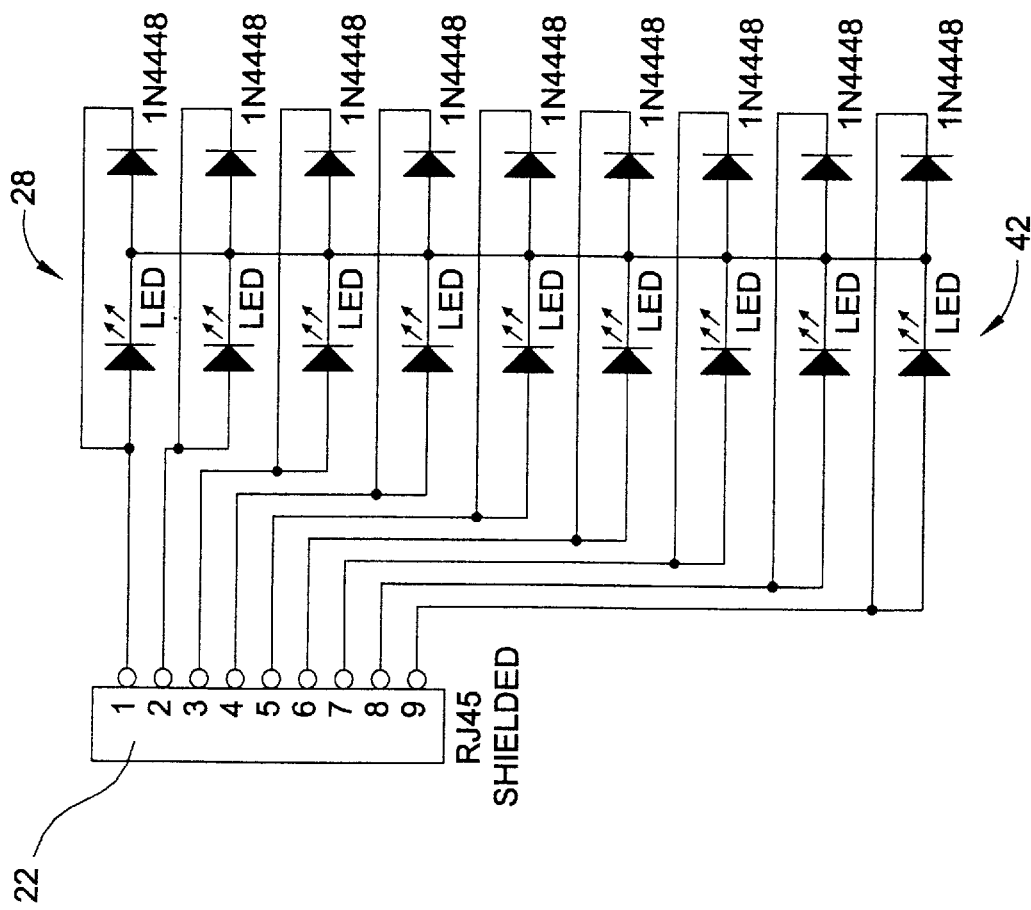

LINE TESTER

RELATED APPLICATIONS

This application claims the benefit of U.S. Provisional Application Ser. No. 60/084,526, filed May 7, 1998.

BACKGROUND

Communication signals, such as those relating to voice or data, are generally transmitted along cables where each cable includes several individual lines for carrying different individual communication signals. Common communication cables include four, six or eight lines where each line carries a separate signal. When one or more of the signals transmitted over a cable fail to reach the destination, it is often important not only to determine which portion of the cable is defective, but which line within the cable is defective so that appropriate corrective action can be taken. Furthermore, at times it is beneficial to be able to characterize the type of line failure which is preventing the successful reception of a communication signal.

A cable testing system is presently commercially available for testing communication cables and pairs of lines contained therein. Specifically, the cable testing system includes a single main unit which is powered, and a plurality of remote modules which are not powered. The main unit has several indicator lights thereon and is controlled by a microprocessor. In contrast, none of the remote modules include indicator lights. Each remote module has an "electronic address" which can be determined by the main unit. In other words, the main unit is able to distinguish one remote module from another. This will become more evident upon reviewing the following brief description of how this prior art cable testing system operates.

To test, for example, two cables, one remote module is connected to an end of a first cable, and another remote module is connected to an end of a second cable. Then, the main unit is connected to the other end of the first cable, and the main unit is operated to send signals along the cable to the first remote module. Specifically, the main unit sends a signal along a first line of the cable to the first remote module, and the remote module sends the signal back to the main unit along a second line of the cable. If the main unit does not receive the signal back along the second line of the cable, the main unit reports, using one or more of its indicator lights, that the first line pair has failed the test. The main unit repeats this process for each pair of wires in the cable (i.e. sends a signal along a third line of the cable, and then receives the signal back along a fourth line of the cable, etc.). After testing each pair of wires in the cable, the main unit reports, using the indicator lights, the results of the test such as the type of failure which has been detected and along which pair of lines within the cable the failure has been detected.

Additionally, as the main unit receives the signals back from the remote module, the main unit is able to determine, based upon certain characteristics of the signal received back from the remote module, which remote module is, in fact, connected to the other end of the cable. The main unit reports this identifying information using its indicator lights. For example, while the first remote module may have an "electronic address" of "A" which can be identified by the main unit, the second remote module may have an "electronic address" of "B" which can be identified by the main unit. Therefore, the main unit reports not only whether all the pairs of lines in a cable have passed the test, but also which particular remote module is connected to the other end of the cable which has been tested.

After the first cable has been tested using the main unit, the main unit can be disconnected from the end of the first cable and can be connected to the end of the second cable so that the second cable can be tested. As mentioned, a second remote module may have been connected to the other end of the second cable. Alternatively, the first remote module can be disconnected from the first cable and connected to the end of the second cable, opposite the main unit. To test the second cable and any subsequent cable, the same process is applied as was described above with respect to the testing of the first cable.

One disadvantage of the above-described cable testing system is that it effectively tests a cable by testing pairs of lines within the cable rather than by testing each individual line of the cable. Because the test signal is sent from the main unit to a remote module along one line of a pair, and returns to the main unit along the other line of the pair, it is only possible for the main unit to determine whether a defect exists within a pair of lines, as opposed to being able to determine which line of a particular pair of lines is actually defective. As mentioned, it is generally beneficial to be able to determine which particular line within a cable is defective so that appropriate corrective action can be taken. Additionally, because pairs of wires are tested, it becomes important to be able to determine the type of cable that is being tested (e.g. USOC, 10 Base T, Token Ring, etc.). Therefore, the above-described cable testing system includes a microprocessor in the main unit, and the microprocessor controls the testing of the cable.

Another disadvantage of the above-described cable testing system is that the remote modules cannot be used to test a cable without using the main unit. In other words, the remote modules cannot operate as stand-alone cable testers, and require the association with the main unit to test a cable. This is because it is the main unit which is powered, which has indicating lights, and which contains the microprocessor which controls the testing of the cable.

The present invention provides a cable testing system directed toward overcoming the disadvantages associated with the above-described prior art cable testing system.

OBJECTS AND SUMMARY

An object of an embodiment of the present invention is to provide a line tester and cable testing system for testing the individual lines of a cable, as opposed to testing the lines of the cable in pairs.

Another object of an embodiment of the present invention is to provide a line tester and cable testing system for testing lines of a cable without having to employ a microprocessor.

Still another object of an embodiment of the present invention is to provide a line tester, such as a remote module of a cable testing system, which can operate as a stand-alone line tester.

Briefly, and in accordance with at least one of the foregoing objects, an embodiment of the present invention provides a cable testing system for testing individual lines of a cable. The cable testing system includes a main unit having an input jack and a plurality of identifying lights connected to the input jack, and at least one remote module. The remote module includes an input jack and an output jack, a power source in communication with the output jack, and a plurality of identifying lights connected to the input jack. Preferably, the output jack of the remote module is configured to receive one end of a multiple line cable and the input jacks of both the main unit and remote module are configured to receive the other end of the multiple line cable.

The remote module preferably includes a test signal generator which is connected to the power source and the output jack, and the test signal generator is configured to send test signals sequentially along each line of the cable. Preferably, the remote module also includes an identifying signal generator which is connected to the power source and the output jack, and the identifying signal generator is configured to send an identifying signal along a line of the cable. The identifying signal generator may include a signal generator which is connected to a line selector, where the line selector is set-able to specify which line of the cable the identifying signal is sent along. Preferably, neither the main unit nor the remote module includes a microprocessor, thereby reducing cost. Additionally, preferably the remote module can be used as a stand-alone line tester.

BRIEF DESCRIPTION OF THE DRAWINGS

The present invention and the advantages thereof will become more apparent upon consideration of the following detailed description when taken in conjunction with the accompanying drawings of which:

FIG. 3 is a diagram of a circuit which is contained within the main unit depicted in FIG. 1.

DESCRIPTION

Figure 1:
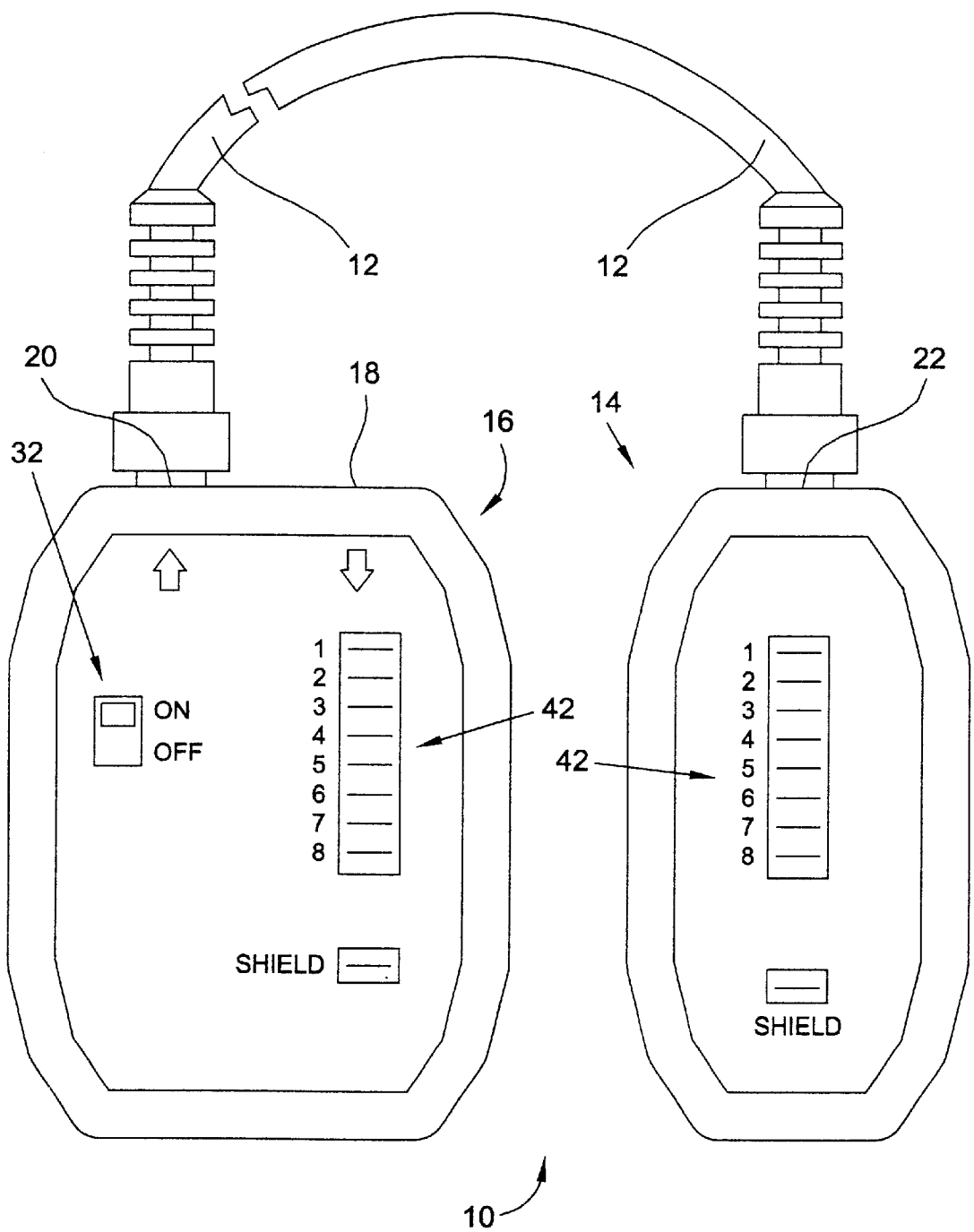
FIG. 1 is a digital photograph illustrating a main unit and a remote module of a cable testing system in accordance with the present invention.

FIG. 1 illustrates a cable testing system 10 which can be used to test individual lines of one or more communications cables 12. The system 10 includes a main unit 14 and one or more remote modules 16 (only one remote module is shown, but all remote modules are preferably the same). The system 10, for example, may include four remote modules, but may include more remote modules. As will be described later herein, the system 10 provides that each module may be used in association with the main unit 14 to test a communications cable. Alternatively, each remote module can be used alone to test a communications cable such as in a case where the ends of the cable are relatively close to each other. Still further, two remote modules can be used to test a communications cable. Regardless of whether the main unit 14 is used in association with a remote module 16, a remote module 16 is used as a stand-alone cable tester, or two remote modules are employed to test a communications cable, the system 10 provides that each individual wire of a cable 12 is tested, as opposed to only being able to test the wires of the cable 12 in pairs as in the prior art. As mentioned, being able to test individual wires of a cable 12 is often important in order to be able to take appropriate action toward correcting the problem.

As shown in FIG. 1, each remote module 16 includes an input jack 18 and an output jack 20. In contrast, the main unit 14 includes only an input jack 22 and does not include an output jack. Preferably, both of the jacks 18, 20 on each remote module 16 and the jack 22 on the main unit 14 are RJ45 shielded connectors, and each jack is configured such that it can readily receive a plug (such as an RJ11 connector or an RJ45 connector) which terminates a four line, six line or eight line cable.

The output jack 20 of each remote module 16 and the input jack 22 of the main unit 14 provide that one end of a cable 12 to be tested can be connected to the output jack 20 of the remote module 16 and the other end of the cable 12 can be connected to the input jack 22 of the main unit 14.

Alternatively, each remote module 16 can be used as a stand-alone cable tester without the remote module 16 having to be used in association with the main unit 14. In this case, one end of the cable 12 which is to be tested by the remote module 16 is plugged into the output jack 20 of the remote module 16, and the other end of the cable 12 is plugged into the input jack 18 of the same remote module 16. A remote module will typically be used as a stand-alone cable tester only in cases where the ends of the cable are relatively close to each other.

Still further, if a remote module 16 is to be used in association with another remote module to test a cable, one end of the cable to be tested is connected to the output jack 20 of the one remote module 16 (as shown in FIG. 1) and the other end of the cable is connected to the input jack of the other remote module.

Figure 2:
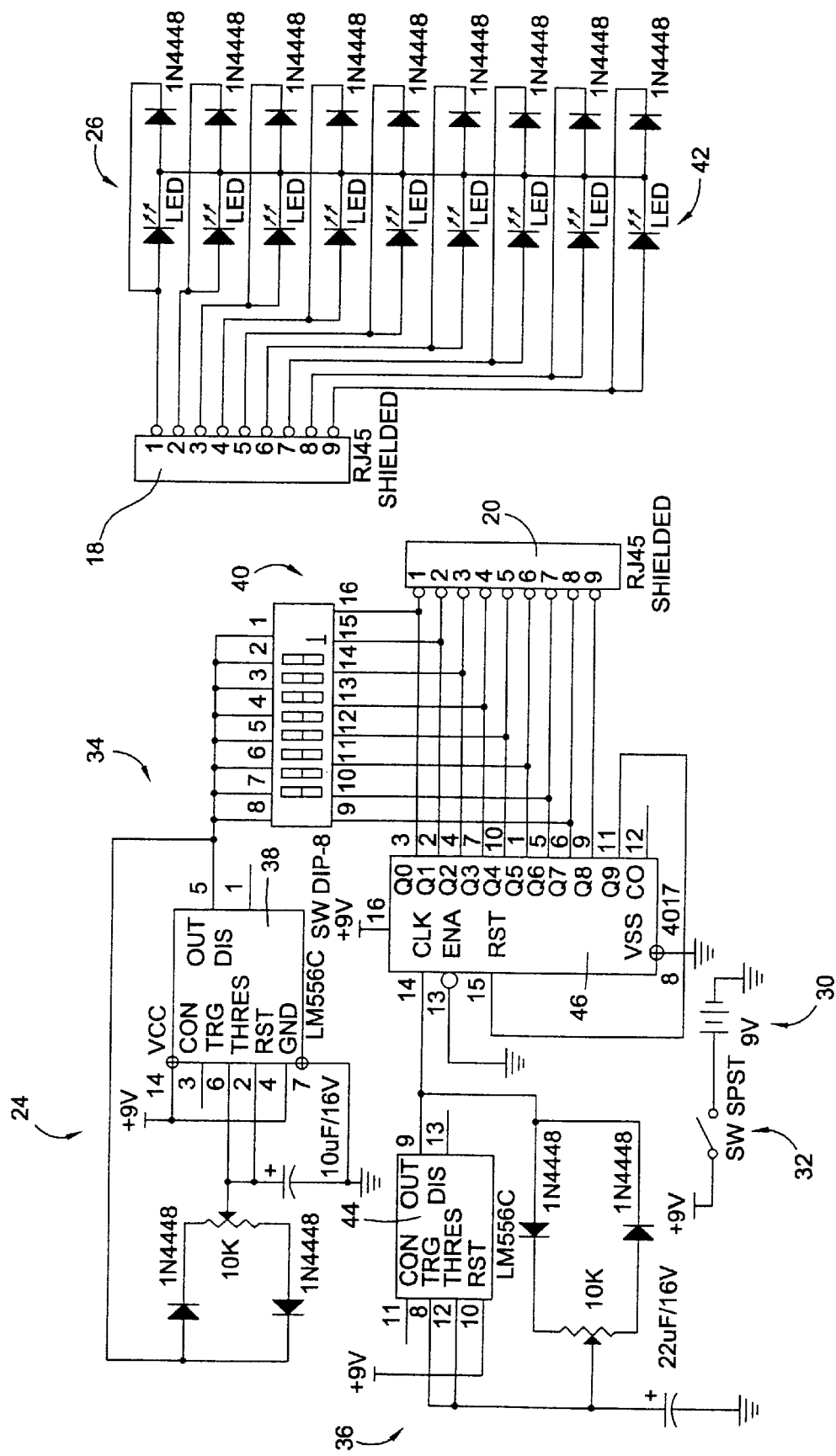
FIG. 2 is a diagram of a circuit which is contained within the remote module depicted in FIG. 1.

As mentioned, regardless of how many remote modules are provided in the system, preferably the remote modules are identical to each other. FIG. 2 illustrates a circuit which is contained within each remote module 16 of the system. More specifically, FIG. 2 illustrates two circuit portions 24 and 26 which become joined to form a complete circuit when the remote module 16 is used as a stand-alone tester. On the other hand, when one remote module is used with another remote module to test a cable, the first circuit portion 24 of the one remote module becomes connected to the second circuit portion 26 of the other remote module to form effectively the same complete circuit.

FIG. 3 illustrates a circuit portion 28 which is contained within the main unit 14. As shown, the circuit portion 28 contained within the main unit 14 is identical to the second circuit portion 26 which is contained within each remote module 16. Therefore, the same circuit is created regardless of whether a cable connects one remote module 16 to the main unit 14 (via the output jack 20 of the remote module 16 and the input jack 22 of the main unit 14—see FIG. 1), connects a remote module 16 to itself (via its output jack 20 and input jack 18), or connects one remote module 16 to another remote module (via the output jack 20 of one remote module and the input jack 18 of the other remote module).

Because the same circuit is formed regardless of whether a remote module 16 is used in association with the main unit 14, a remote module 16 is used as a stand-alone cable tester, or a remote module 16 is used in association with another remote module to test a cable, the components and operation of the circuit which is formed will now be described with reference only to FIG. 2. Then, the operation of the system 10 within the three possible configurations (i.e. remote module/main unit, remote module alone, and remote module/remote module) will be described.

As shown in FIG. 2, the first circuit portion 24 includes a power source 30. Preferably, the power source 30 is a 9 volt alkaline battery. The completed circuit becomes powered by the power source 30 when a power switch 32 (see FIG. 1 also) on the remote module 16 is moved to an "on" position.

The first circuit portion 24 includes an identifying signal generator 34 and a test signal generator 36. As shown, both the identifying signal generator 34 and the test signal generator 36 are powered by the power source 30, and are connected to the output jack 20. The identifying signal generator 34 includes a signal generator 38 and a line selector 40, and it is the signal generator 38 which is connected to the power source 30. Preferably, as will be described, the signal generator 38 provides a pulse signal, but the signal generator 38 may also provide a steady signal. The line selector 40 is preferably a series of DIP switches which are on a PCB (printed circuit board), and require opening the remote module 16 to change the settings thereof. Alternatively, the line selector 40 may be a rotary switch.

As will be described more fully later herein, the setting of the line selector 40 sets the "address" of the remote module 16. In other words, the setting characterizes the remote module relative to the other remote modules. Preferably, the setting of the line selector 40 provides that the pulse or steady signal which is generated by the signal generator 38 is transmitted to only one line of the output jack 20. Therefore, the signal travels along a corresponding single line of the cable 12 connected to the output jack 20 to a corresponding single line of the input jack to which the other end of the cable 12 is connected.

The second circuit portion 26 (and circuit portion 28 shown in FIG. 3) includes a row of indicator lights 42 (also shown in FIG. 1). Preferably, the row of indicator lights 42 is provided as an LED (light emitting diode) bar graph. However, the row of indicator lights 42 may also be provided as individual LEDs. As mentioned, the identifying signal generator 34 preferably provides that a pulse signal or steady signal travels along a corresponding single line of the cable 12 connected to the output jack 20 to a corresponding single line of the input jack to which the other end of the cable 12 is connected. Hence, the signal drives a single light of the row of indicator lights 42, and causes that single light to pulse or flash continuously (if a pulse signal is transmitted) or stay energized (if a steady signal is transmitted). Therefore, the "address" of the remote module 16 providing the identifying signal can be identified by which light is caused to continuously flash or stay lighted. For example, if the first indicator light continuously flashes or stays lighted, "Remote 1" is sending the identifying signal. On the other hand, if the second indicator light continuously flashes or stays lighted, "Remote 2" is sending the identifying signal, etc. Preferably, each remote module includes external indicia, such as a sticker on an external surface of the module, which identifies the "address" of that particular remote module (e.g., while one remote module has a sticker thereon which indicates that remote module as being "Remote 1" , another remote module has a sticker thereon which indicates that remote module as being "Remote 2", etc.).

As mentioned, the first circuit portion 24 also includes a test signal generator 36. The test signal generator 36 includes a pulse signal generator 44 and a sequencing element 46, and both are connected to the power source 30. The sequencing element 46 provides that the pulse signal which is generated by the pulse signal generator 44 is transmitted to the lines of the output jack 20 in a sequential fashion. Therefore, the signal travels sequentially along the lines of the cable 12 connected to the output jack 20 to corresponding lines of the input jack to which the other end of the cable is connected. Hence, the pulse signal drives each light in the row of indicator lights 42 in a sequential fashion. In other words, the test signal causes the row of indicator lights 42 to be energized one light at a time in a sequential manner (e.g. cascading from the first to the eighth light in the row if an eight line cable is being tested, cascading from the second to the seventh light in the row if a six line cable is being tested, etc.). Therefore, the identifying signal identifies which remote module is sending the test signals along the cable 12, and the identification signal is sent simultaneously with the test signals. Although not specifically shown, overload protection may be provided in connection with the input jacks of the main unit and each of the remote modules.

To provide an example, operation of the main unit 14 with four remote modules 16 to test four different communications cables will now be described. First, each of the four remote modules are connected to an end of a respective cable, i.e. an end of a first cable 12 is connected to the output jack 20 of a first remote module 16, an end of a second cable is connected to the output jack of a second remote module, an end of a third cable is connected to the output jack of a third remote module, and an end of a fourth cable is connected to the output jack of a fourth remote module. After the ends of the cables have been connected to the remote modules, the other end of the first cable 12 is connected to the input jack 22 of the main unit 14 (FIG. 1 illustrates a cable connected to a remote module 16 and the main unit 14), and the power switch 32 on the first remote module 16 is switched to the "on" position. This causes the power source 30 in the first remote module 16 to power the circuit created by the connection. Hence, the first remote module 16 sends a remote module identifying signal and cable line test signals, along the cable 12, to the main unit 14.

As mentioned, preferably each remote module has its selector 40 set to a different setting. This provides that the identifying signal is sent along a different line of the cable for each remote module. So, while the first remote module 16 may cause the first light in the row of indicator lights 42 on the main unit 14 to continuously blink (or stay continuously lighted), the second remote module may cause the second light in the row of indicator lights 42 on the main unit 14 to continuously blink (or stay continuously lighted), etc.

Assuming the cable is not defective, the first remote module 16 will cause all the lights 42 on the main unit 14 to blink in sequential order, and will cause the first light on the main unit 14 to blink continuously (or stay continuously lighted). The sequential blinking of all the lights 42 on the main unit 14 indicates that the test signal generated by the remote module 16 has successfully traveled along each of the lines of the cable 12 to the main unit 14, and none of the lines of the cable 12 are open or shorted. The continuous blinking (or continuous energizing) of one of the lights on the main unit 14 identifies which remote module is sending the signals to the main unit 14.

If there is a short in the cable 12, for example, between the second and third lines of the cable, the test signal transmitted to the second line of the cable 12 will end up traveling along both the second and third lines of the cable 12. Likewise, the next test signal transmitted to the third line of the cable 12 will also end up traveling along both the second and third lines of the cable 12. As a result, the second and third lights on the main unit 14 will blink together twice and less brightly than the other lights on the main unit 14. On the other hand, if, for example, one of the lines of the cable 12 is open (e.g., forms an open circuit because of a break in the line), the light on the main unit 14 which corresponds to that particular line of the cable 12 will not blink at all because the signal transmitted along that cable line will never reach the main unit 14. Therefore, those lights on the main unit 14 which are not energized during the sequential lighting of the row of lights indicate which lines of the cable 12 are open, those lights on the main unit 14 which blink together indicate which lines of the cable 12 have a short circuit condition, and the continuous blinking (or continuous energizing) of one of the lights on the main unit 14 indicates which remote module is sending the signals to the main unit 14. If none of the lights on the main unit 14 blink continuously (or stay energized), and all but one of the lights on the main unit 14 blink sequentially, this indicates that the open line (i.e. the line which corresponds to the light which does not light at all) would otherwise be carrying the identifying signal to the main unit 14. For example, if light number three on the main unit 14 does not light at all, the other lights do light in sequential order, and none of the lights are continuously blinking (or stay energized), this indicates that remote module number three (a remote module with its selector 40 set such that the identifying signal is sent over the third line in the cable) is sending the test signals and the third line in the cable 12 is open.

In this manner, the main unit 14 and the first remote module 16 can be used to test the individual lines of the first cable 12. After the main unit 14 is used in association with the first remote module 16 to test the first cable 12, the power switch 32 on the first remote module 16 can be turned to the "off" position, and the first cable 12 can be disconnected from the input jack 22 of the main unit 14. Then, the end of the second cable, which is opposite the end which is connected to the second remote module, can be connected to the input jack 22 of the main unit 14. Then, the power switch 32 on the second remote module can be turned to the "on" position, and the second cable can be tested in much the same manner as the first cable. Subsequently, the main unit 14 can be connected to the third cable and the fourth cable to test them using the third and fourth remote modules, respectively.

As mentioned, each remote module 16 can also be used as a stand-alone cable tester by connecting one end of a cable 12 to the output jack 20 and the other end of the cable to the input jack 18 of the remote module 16. After the cable 12 is so connected, the power switch 32 on the remote module 16 is turned to the "on" position, and the cable 12 is tested in much the same manner as was described above except the lights which will be lighted are on that remote module 16 itself rather than on the main unit 14. In other words, the same remote module 16 is both sending and receiving signals over the cable being tested, and the lights on that remote module 16 indicate the results of the test as well as identifies which remote module 16 is being used to perform the test.

As also mentioned above, one end of a cable to be tested can be connected to the input jack 18 of one remote module 16 and the other end of the cable can be connected to the output jack of another remote module. Then, the power switch 32 of the remote module 6 which has the cable connected to its output jack 20 is switched to the "on" position. This causes the lights on the other remote module to operate, as described above in relation to the main unit 14, to indicate the results of the test and to identify which remote module is sending the signals.

Regardless of which configuration is used to test a cable, the cable testing system provides that individual wires of a cable are tested as opposed to the testing wires of the cable in pairs. As a result, it is not imperative to determine the configuration of the wiring of the cable (e.g. USOC, 10 Base T, Token Ring, etc.), and it is not imperative that any of the remote modules or the main unit include a microprocessor. Due to the cost factor of including a microprocessor, eliminating the need for a microprocessor is an important advantage, and one which the prior art which has been described above does not provide.

The described cable testing system provides several advantages. For example, it provides that individual lines of a cable are tested as opposed to testing the wires only in pairs. The system also provides that each of the remote modules can be used as a stand-alone tester. Additionally, the system is able to test the individual lines of a cable without having to employ a microprocessor. Of course, there may be still other advantages which would be appreciated by one having ordinary skill in the art.

While a preferred cable testing system is shown and described, it is envisioned that those skilled in the art may devise various modifications thereto without departing from its spirit.

What is claimed is:

1. A cable testing system for testing individual lines of a cable, said cable testing system comprising: a non-powered main unit having an input jack and a plurality of identifying lights connected to said input jack; and a plurality of powered remote modules, each of said remote modules having an input jack and an output jack, a power source in communication with said output jack of said remote module, and a plurality of identifying lights connected to said input jack of said remote module, each of said remote modules having an address and configured to test the continuity and short circuit of each of the individual lines of the cable both as a stand-alone line tester without the main unit and as a system with the main unit, each of said remote modules configured to communicate said address along the cable without having to use a microprocessor, and configured to display said address using said identifying lights of said powered remote module when used as a stand-alone line tester without the non-powered main unit, and configured to display said address using said identifying lights of said non-powered main unit when used as a system with said non-powered main unit, wherein neither said main unit nor any of said remote modules includes a microprocessor.

2. A cable testing system as recited in claim 1, said remote module including an identifying signal generator connected to said power source and to said output jack of said remote module, said identifying signal generator configured to send an identifying signal along one line of the cable.

3. A cable testing as recited in claim 2, said identifying signal generator comprising a signal generator connected to a line selector, wherein said line selector is set-able to specify which line of the cable the identifying signal is sent along.

4. A cable testing as recited in claim 1, said remote module including a test signal generator connected to said power source and to said output jack of said remote module, said test signal generator configured to send test signals along each line of the cable which is received by said output jack of said remote module, and said main unit including an identifying signal generator connected to said power source and to said output jack of said remote module, said identifying signal generator configured to send an identifying signal along one line of the cable which is received by said output jack of said remote module.

5. A cable testing system as recited in claim 4, said test signal generator being configured to send the test signals sequentially along each line of the cable.

6. A cable testing system as recited in claim 4, said identifying signal generator comprising a signal generator connected to a line selector, wherein said line selector is set-able to specify which line of the cable the identifying signal is sent along.

* * * * *